United States Patent [19]
Worden

[11] 3,934,733
[45] Jan. 27, 1976

[54] TRANSFER DEVICE

[76] Inventor: Raymond D. Worden, P. O. Box 36010, Houston, Tex. 77036

[22] Filed: Oct. 10, 1974

[21] Appl. No.: 513,878

[52] U.S. Cl. .................. 214/1 Q; 214/301; 206/72; 432/239
[51] Int. Cl.² .......................................... B65G 3/00
[58] Field of Search ...... 206/445, 72; 214/301, 300, 214/306, 307, 1 Q; 432/253, 258, 261, 75, 86, 93, 239, 126

[56] References Cited
UNITED STATES PATENTS 2,726,771  12/1955  Cozzoli ............................ 214/301
3,534,862  10/1970  Shambelan ........................ 206/72

FOREIGN PATENTS OR APPLICATIONS 544,097  1/1956  Belgium ............................ 214/300

Primary Examiner—John J. Camby
Assistant Examiner—Henry C. Yuen

[57] ABSTRACT

This patent discloses a transfer system for transferring discs from a furnace boat to a cleaning carrier in which alternate discs are transferred from the boat to a carrier and then the remainder of the discs are transferred to a carrier.

3 Claims, 10 Drawing Figures

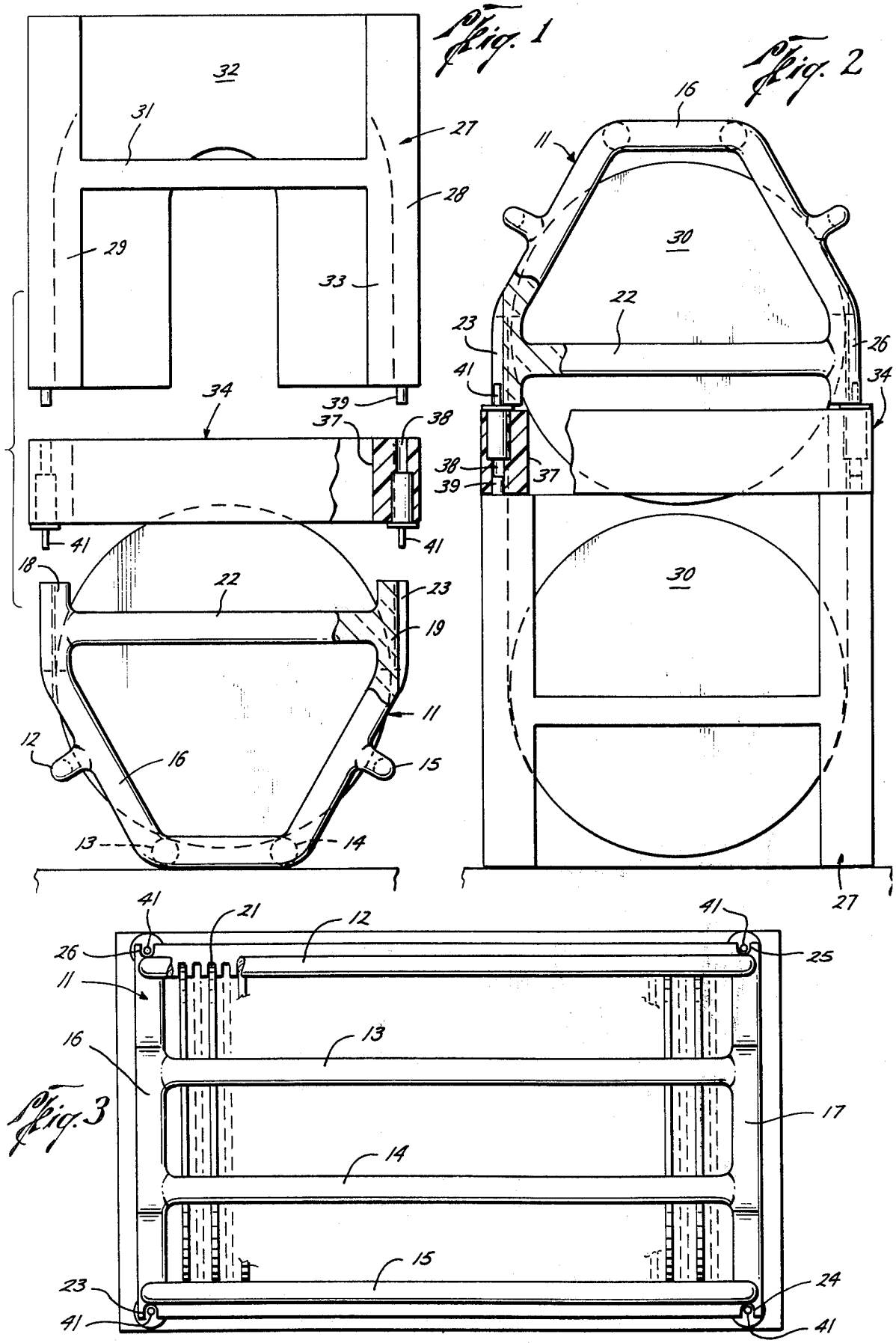

TRANSFER DEVICE

This invention relates to transfer devices and more particularly to a transfer system for transferring a number of discs such as silicone discs from a supporting device into another supporting device such as a carrier.

Silicon discs are usually treated in furnaces. During this treatment they are placed in quartz containers known as boats. They are positioned very close to each other in the furnace boat. After treatment in the furnace, the silicon discs or wafers are transferred to cleaning boats or carriers. In these carriers the spacing between adjacent discs is twice the spacing of the furnace boats to facilitate cleaning and other operations. Thus, there has existed a problem of quickly and readily transferring the contents of a furnace boat into two cleaning carriers in which the space between the discs or wafers to be treated has been doubled.

It is an object of this invention to provide a transfer system for discs in which discs are transferred from a furnace boat into a cleaning carrier in which half of the discs are simultaneously transferred to a carrier and then the remaining discs are simultaneously transferred to another carrier.

Another object is to provide a transfer adapter for sandwiching between a furnace boat and a cleaning boat which will retain every other disc within the furnace boat while permitting the remaining discs to pass through the adapter into a cleaning boat and further in which movement of the transfer adapter to a second position will permit transfer of the remaining discs into a cleaning boat.

Other objects, features and advantages of this invention will be apparent from the drawings, specification and the claims.

In the drawings wherein illustrative embodiments of this invention are shown and wherein like parts are indicated by like numerals, FIG. 1 is an end view of a furnace boat, a transfer adapter and carrier, each spaced slightly from the other, but arranged in position to sandwich the adapter between the boat and carrier with portions of the devices shown in cross section;

FIG. 2 is a view similar to FIG. 1 in elevation with parts shown in cross section in which the transfer adapter has been sandwiched between the boat and carrier and the entire assembly inverted from the FIG. 1 position to permit one-half of the discs to move from the boat into the carrier;

FIG. 3 is a top view of the assembly shown in FIG. 2;

Figure 4:
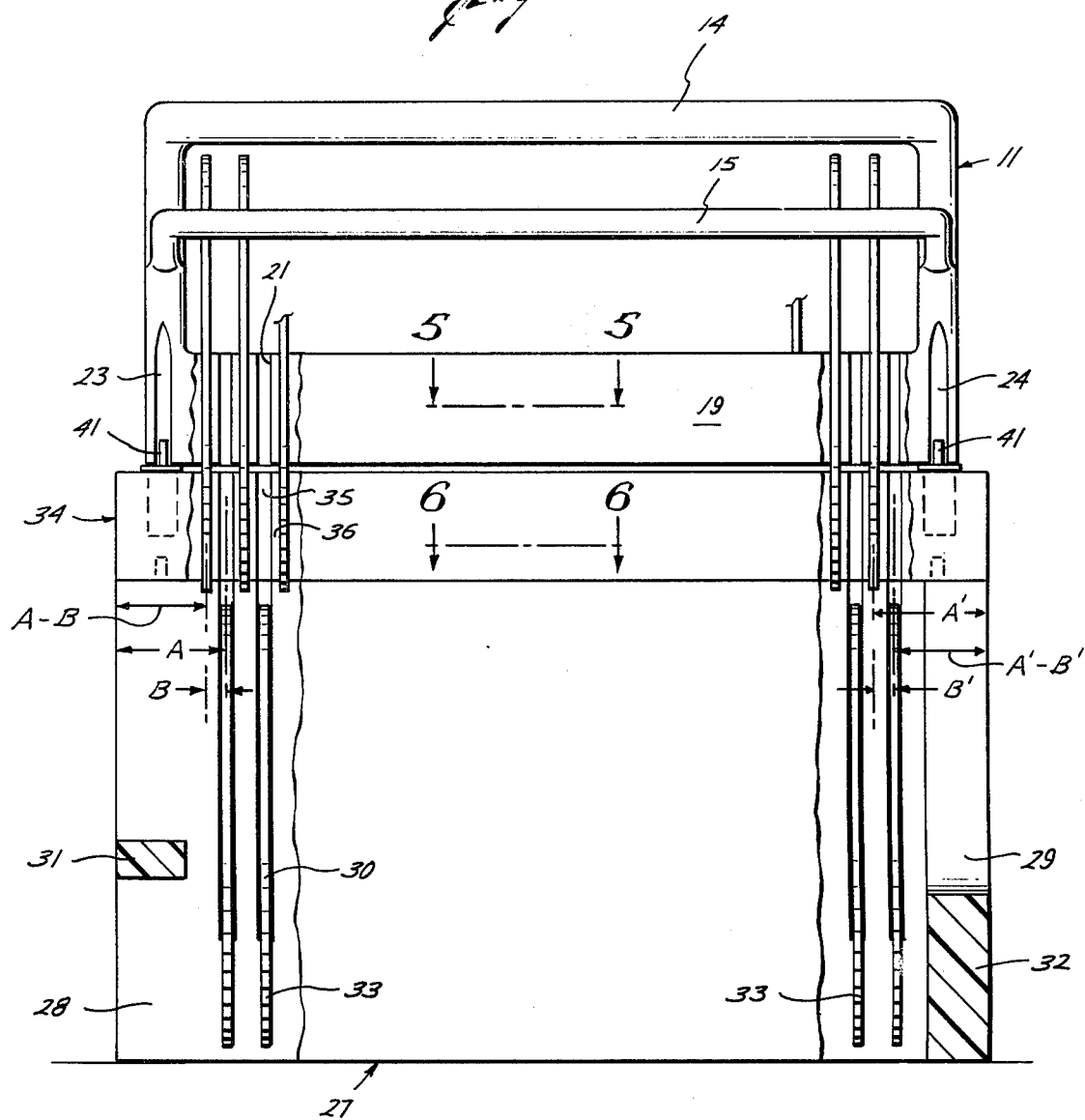
FIG. 4 is a side view of the assembly shown in FIG. 2 with the carrier shown in vertical cross section.

Referring first to FIGS. 1, 2 and 3, a conventional boat indicated generally at 11 is illustrated.

The boat is fabricated from quartz and includes the plurality of longitudinal quartz rods 12, 13, 14 and 15 to which the end quartz pieces 16 and 17 are attached. Also extending lengthwise of the boat are quartz members 18 and 19 which are positioned on opposite sides of the boat and are provided with a multitude of confronting slots 21 (FIG. 3). At the end of the boat, and extending between the members 18 and 19, are reinforcing ribs, one of which is shown at 22 (FIG. 1).

At each of the four corners of the boats in symmetrical arrangement therein, aligning slots 23, 24, 25 and 26 are positioned (FIG. 3). The boat as above described is conventional in form and any desired conventional form of boat may be substituted therefor.

Also shown in FIGS. 1, 2 and 3 is a conventional cleaning carrier, or boat, shown generally at 27.

The carrier 27 is normally made of plastic and includes two side standards 28 and 29, which are joined at their opposite ends by the cross-bar 31 and the slotted cross-member 32. A plurality of slots 33 are provided in the carrier for receiving discs or wafers 30 from the boat 27.

A transfer apparatus indicated generally at 34 permits the passage of alternate discs therethrough in one position of the transfer apparatus and the remainder of the discs therethrough in another position of the transfer device. The transfer device is generally rectangular in shape with a plurality of alternate slots 35 and lands 36 (FIG. 4) on opposite sides of the passageway 37 (FIG. 1) extending through the transfer apparatus. The lands 36 could extend all the way across the transfer apparatus, but for convenience of manufacturer it is preferred that an open bore be provided through the transfer apparatus and that the slots and lands be provided at opposite sides of the bore as illustrated.

The number of slots per inch provided in transfer apparatus 34 is equal to one-half of the number of slots per inch provided in boat 27. It of course follows that the number of lands in the transfer apparatus per inch are equal to one-half the number of slots per inche in boat 27, or, stated another way, the total number of lands and slots in the transfer apparatus 34 are equal to the number of slots in the boat 11.

The number of slots provided in the carrier 27 is also equal to the number of slots provided in the transfer apparatus 34.

In order to align the slots between the transfer apparatus 34 and the carrier 27, suitable means such as matching holes 38 in the adapter 34 and dowel pins 39 carrier by the carrier 27 are provided. As illustrated in the drawings, these holes and dowel pins are provided at each corner of the transfer apparatus 34 and the carrier 27 and align the grooves in the carrier with the grooves in the transfer apparatus as illustrated in FIG.

4. With the grooves thus aligned, any discs that are free to pass through the transfer apparatus will pass into the carrier.

Means are provided for aligning the adapter slots in one position with alternate slots in the furnace boat 11 so that one-half of the boat's capacity of discs may pass through the adapter into the carrier with the boat carrier and adapter positioned as shown in FIG. 4. Such means may be provided by the slots 23 through 26 as hereinabove identified and dowel pins 41, which are symmetrically carried at each corner of the adapter as shown in FIG. 1 through 8.

As the number of slots 35 in the adapter 34 are only one-half of the slots 21 in the boat 17, it will result that the slots at one end of the transfer adapter and one end of the boat are in alignment as shown to the righthand side of FIG. 4 while a land is in alignment with the last slot in the boat at the opposite end of the transfer apparatus. Thus, the first disc in the boat beginning from the right of the FIG. 4 position, will pass through the transfer apparatus while the first disc beginning at the left of the boat, as viewed in FIG. 4 will be retained in the boat by the transfer apparatus. This relationship is illustrated by the comparison of distance A from the edge of the adapter which is used as a reference point, to the center line of the most adjacent slot and the distance $A^1$, which is the same as A, between the edge of the adapter and the center line of the land between slots. It will further be noted that the distance B and $B^1$, which is the distance between the center line of adjacent grooves and lands in the adapter 34, may be subtracted from the distance A and $A^1$ to give the resulting A-B and $A^1$-$B^1$, as shown in the drawings, which is the distance from the end of the adapter to the first land in the case of A-B and from the end of the adapter to the first groove on the other end which is $A^1$-$B^1$.

Figure 5:
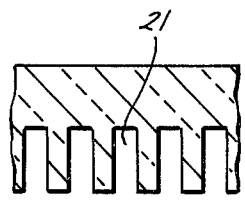
FIG. 5 is a fragmentary cross sectional view taken along the lines 5—5 showing the wafer receiving slots in the boat and omitting for clarity the structure therebelow.
Figure 6:
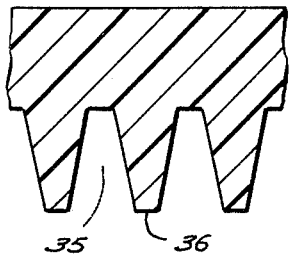
FIG. 6 is a fragmentary sectional view taken along the line 6—6 and omitting the structure therebelow for clarity illustrating the lands and grooves in the transfer adapter.
Figure 7:
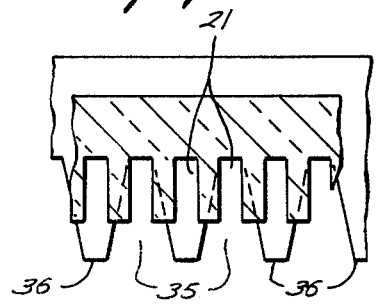
FIG. 7 is a view of the boat slot structure FIG. 5, superimposed upon the lands and slots of the adapter of FIG. 6 illustrating the manner in which alternate discs are obstructed by the lands in the transfer apparatus and the remaining discs permitted to pass through the transfer apparatus into the carrier.

This relationship is further illustrated in FIGS. 5, 6 and 7. In FIG. 7 it is shown that the alternate grooves 21 line up with grooves 35 in the transfer adapter and in like manner, alternate grooves 21 align with the lands 36 in the transfer adapter.

Figure 8:
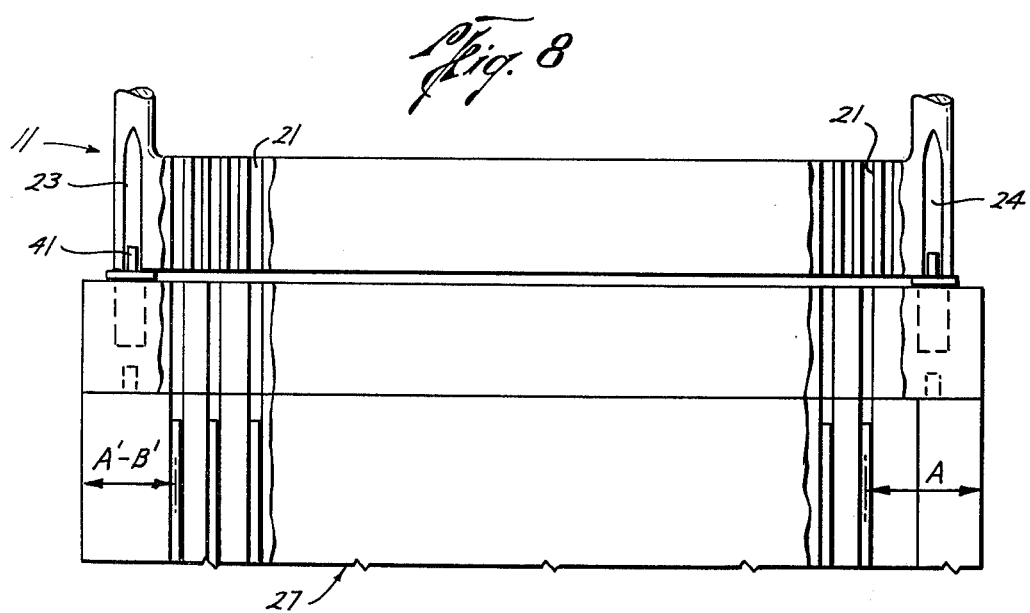
FIG. 8 is a fragmentary view of the boat adapter and carrier seen in side elevation with parts broken away to show in comparison with similar structure in FIG. 4, the manner in which the transfer adapter permits one-half of the wafers to pass therethrough in FIG. 4 and then upon reversal permits the other half of the wafers to pass therethrough in FIG. 8.

It will be seen from FIG. 4 that as the distance A-B is equal to the distance $A^1$-$B^1$, that swapping ends of the boat 11 relative to the carrier 27 and the transfer adapter 34 will result in the arrangement shown in FIG. 8 so that the grooves which were blocked by lands in the FIG. 4 arrangement will now be in alignment with grooves in the transfer adapter and the remaining discs may pass therethrough as illustrated in FIG. 8.

Figure 9:
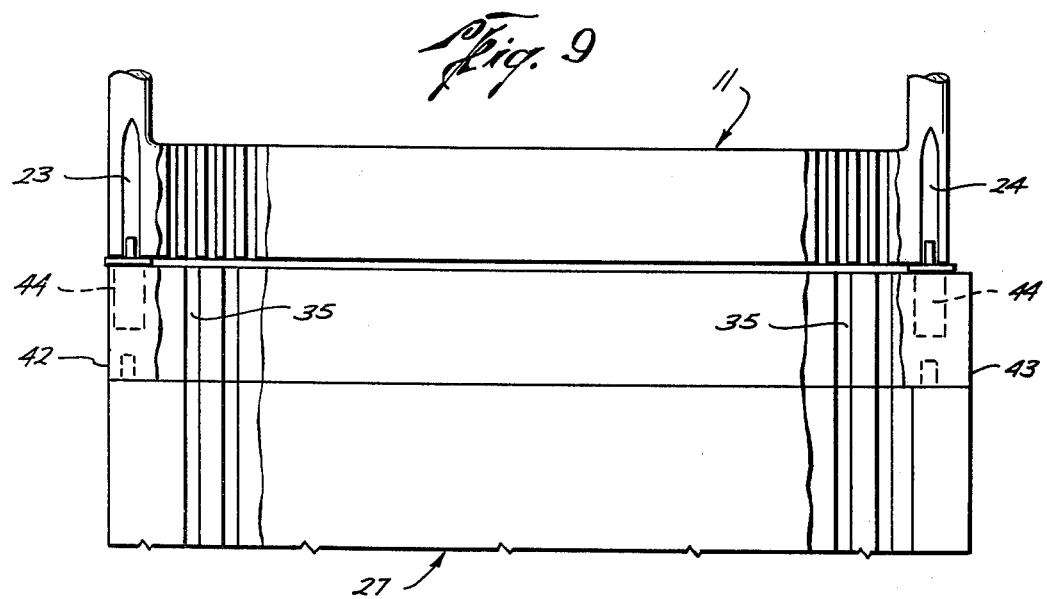
FIGS. 9 and 10 are similar fragmentary views in side elevation with parts broken away to illustrate the alignment of the slots in the transfer apparatus with different slots in the boat when the transfer apparatus is provided with asymmetrical dowels or alignment means which cooperates with symmetrical aligning means in the boat.
Figure 10:
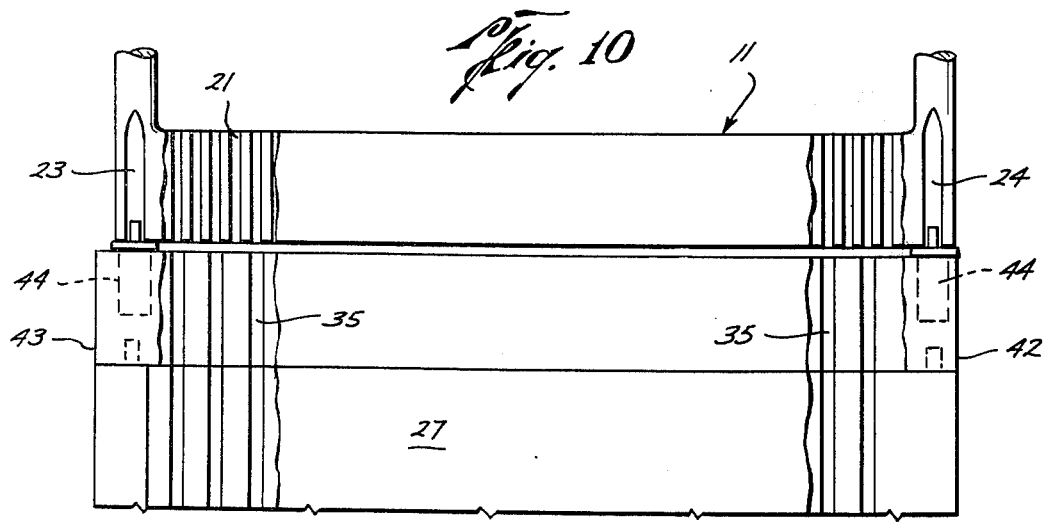

In FIGS. 9 and 10, an alternative form of this invention is shown. In this form of the invention, the grooves 35 in the transfer adapter are symmetrical relative to the ends 42 and 43 of the adapter. That is, they are equal distance therefrom. In order to provide for the two positions of the adapter relative to the furnace boat, that is the one position in which one-half of the discs may pass therethrough and the other position for aligning the boat with the remainder of the slots as shown in FIG. 8, a different aligning configuration is utilized. As shown, the dowel pins 44 are not symmetrical relative to the slots. The dowel pin on the left-hand side of the adapter as viewed in FIG. 9 is further away from the most adjacent slot than the pin 44 on the right-hand side of the adapter. This spacing is such that when the boat is reversed, or swapped end to end, relative to the adapter, a different group of alternate slots will be aligned. It is also apparent that other suitable steps could be provided so that the transfer apparatus could merely be slid longitudinally relative to the boat between its two positions.

In use of the device, a furnace boat filled with discs and a carrier having only half as many slots as the furnace boat are positioned opposite each other with the transfer adapter therebetween as shown in FIG. 1. The assembly is then inverted to the FIG. 4 position and every other disc falls through the slots in the transfer adapter into the carrier. The transfer adapter and boat may then be lifted free of the carrier inverted so that the boat supports the discs and the transfer adapter rotated 180° and re-engaged with the boat in the position shown in FIG. 8. A new carrier 27 is then positioned over the furnace boat and adapter to sandwich the adapter between the boat and carrier and the assembly again inverted to the FIG. 8 position. At this time, the remaining discs fall into the second carrier.

The use of the apparatus shown in FIGS. 9 and 10 is identical to that just described as the difference in positioning of the dowel pins 44 serves the same function as the special alignment of the lands and grooves in the form of apparatus shown in FIG. 1 through 8.

The foregoing disclosure and description of the invention are illustrative and explanatory thereof and various changes in the size, shape and materials, as well as in the details of the illustrated construction, may be made within the scope of the appended claims without department from the spirit of the invention.

What is claimed is:

1. Transfer apparatus comprising;
    at least one disc carrier having slots for receiving and supporting a plurality of side-by-side discs,
    a boat having twice as many slots per inch for receiving and supporting discs as said carrier,
    a transfer adapter having alternate lands and slots extending therethrough for directing discs from said boat to said carrier when the adapter is sandwiched between said boat and carrier,
    said adapter having the same number of slots per inch as said carrier,
    said carrier and adapter having means in interengagement holding the slots therein in alignment when the adapter is in engagement with a boat,
    and means for aligning the adapter slots in one position with alternate slots in the boat to transfer one-half of a boat's capacity of discs to said carrier while the lands prevent the transfer of the remainder of the discs and in another position for aligning the adapter slots with the remaining slots in the boat for transferring the remainder of the boat's capacity to a carrier.

2. Transfer apparatus comprising,
    a boat having slots for receiving and supporting discs,
    a transfer adapter having alternate lands and slots extending therethrough which in total are equal in number per inch to the number of slots per inch in the boat,
    and means for aligning the adapter slots in one position with alternate slots in the boat to retain one-half of the boat's capacity while permitting discs from alternate boat slots to pass through the adapter and in another position to permit the remainder of the discs in the boat to pass through the adapter.

3. A transfer adapter for transferring discs from a boat to a carrier comprising,
    a rectangular body having a plurality of alternate slots and lands extending therethrough, and means on said body for engaging a boat to align the adapter and boat one relative position with the slots in the adapter aligned with alternate slots in a boat and in another relative position to align the slots in the adapter with the remaining slots in a boat.

* * * * *